(12) United States Patent
Naum et al.

(10) Patent No.: US 8,044,410 B2
(45) Date of Patent: Oct. 25, 2011

(54) WHITE LIGHT-EMITTING DIODE AND ITS LIGHT CONVERSION LAYER

(75) Inventors: Soshchin Naum, Changhua (TW); Wei-Hung Lo, Taipei (TW); Chi-Ruei Tsai, Taipei (TW)

(73) Assignee: Wei-Hung Lo, Taipei (TW)

( * ) Notice: Subject to any disclaimer, the term of this patent is extended or adjusted under 35 U.S.C. 154(b) by 151 days.

(21) Appl. No.: 12/497,926

(22) Filed: Jul. 6, 2009

(65) Prior Publication Data
US 2010/0006875 A1    Jan. 14, 2010

(30) Foreign Application Priority Data

Jul. 11, 2008    (TW) ................................ 97126241 A

(51) Int. Cl.
*H01L 27/15* (2006.01)
*H01L 29/26* (2006.01)
*H01L 31/12* (2006.01)
*H01L 33/00* (2010.01)

(52) U.S. Cl. ............... 257/79; 257/94; 257/E33.061; 438/22

(58) Field of Classification Search ............... None
See application file for complete search history.

(56) References Cited

U.S. PATENT DOCUMENTS

| 6,538,371 B1 * | 3/2003 | Duggal et al. ............ 313/486 |
| 2009/0179212 A1 * | 7/2009 | Naum et al. ............ 257/98 |
| 2009/0218585 A1 * | 9/2009 | Zhuang et al. ............ 257/98 |

FOREIGN PATENT DOCUMENTS

JP    49020087 A  *  2/1974

* cited by examiner

*Primary Examiner* — Ha Tran T Nguyen
*Assistant Examiner* — Shaka Scarlett
(74) *Attorney, Agent, or Firm* — Guice Patents PLLC

(57) ABSTRACT

The present invention discloses a white light-emitting diode based on In—Ga—N nitride heterojunction is characterized by that the light-emitting diode has primary blue light emission of a specific wavelength and a light conversion layer so as to generate white light. Further, the present invention also discloses a light conversion layer and its fluorine oxygen garnet phosphor powder.

8 Claims, 8 Drawing Sheets

Spectroradiometric Analysis Report for Phosphor

Product : Gd-370-al-1485c-465nm-20ma
Manufacturer :
Client :
Sample No. :                           Date : April 8, 2008
Tested By :                            Reviewed By :

Test Condition
Temperature :   °C                     RH : %
Ref. Gain : 64                         Spe. Gain : 4
Spectrum Range : 380-780 nm            Scan Step : 5 nm Spectroradiometric Parameters

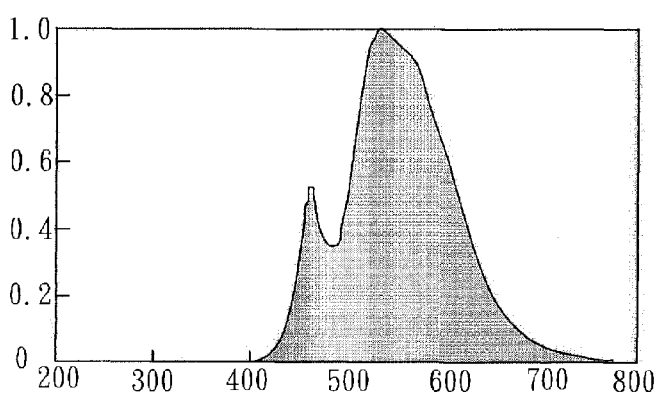

Spectral Distribution

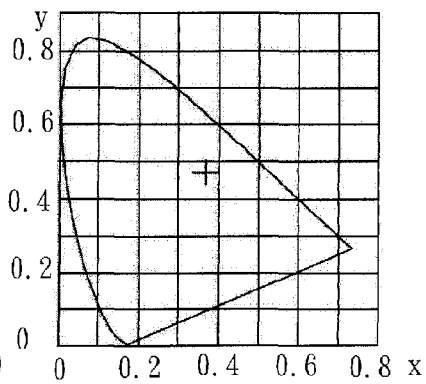

CIE1931 Chromaticity Diagram

Chromaticity Coordinates : x=0.3692 y=0.4710 u=0.1866 v=0.3571
Correlated Color Temperature : 4716 K
Brightness : 35098.4
Reference White : C Light            Peak Wavelength : 541.0 nm
Dominant Wavelength : 565 nm         Bandwidth : 114.4 nm
Purity : 0.5781                      Radiant Brightness : 85.95
Color Ratio : Kr=35.9%  Kg=40.8%  Kb=23.3%
Rendering Index : Ra=61.5
R1=51    R2=70    R3=92    R4=49    R5=51    R6=63    R7=80    R8=36
R9=-94   R10=36   R11=42   R12=21   R13=57   R14=95   R15=37

SPR-920D Analyzer System for Phosphor
Spectroradiometric made by
Zhejiang University Sensing Instruments Co., Ltd.

FIG. 2

Spectroradiometric Analysis Report for Phosphor

Product : Gd-356-2-w-a1-1485c-465nm-20ma
Manufacturer :
Client :
Sample No. :                                    Date : April 8, 2008
Tested By :                                     Reviewed By :

Test Condition
Temperature :    °C                             RH : %
Ref. Gain : 64                                  Spe. Gain : 4
Spectrum Range : 380-780 nm                     Scan Step : 5 nm Spectroradiometric Parameters

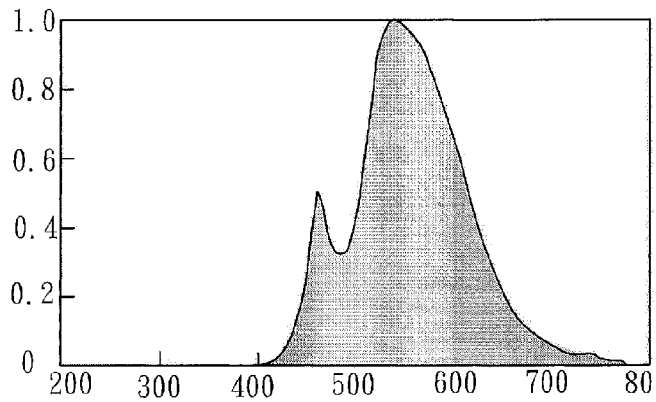 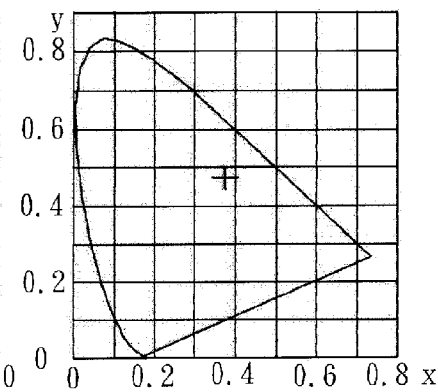

Spectral Distribution                           CIE1931 Chromaticity Diagram

Chromaticity Coordinates : x=0.3741 y=0.4731 u=0.1887 v=0.358
Correlated Color Temperature : 4623 K
Brightness : 35140.9
Reference White : C Light                       Peak Wavelength : 542.2 nm
Dominant Wavelength : 566 nm                    Bandwidth : 112.5 nm
Purity : 0.5990                                 Radiant Brightness : 85.745
Color Ratio : Kr=36.9%  Kg=40.9%  Kb=22.2%
Rendering Index : Ra=61.1
R1=50     R2=69     R3=92     R4=49     R5=50     R6=61     R7=80     R8=36
R9=-93    R10=34    R11=41    R12=19    R13=57    R14=95    R15=37

SPR-920D Analyzer System for Phosphor
Spectroradiometric made by
Zhejiang University Sensing Instruments Co., Ltd.

FIG. 3

Spectroradiometric Analysis Report for Phosphor

Product : Gd-356-1-w-a1-1485c-465nm-20ma
Manufacturer :
Client :
Sample No. :                          Date : April 8, 2008
Tested By :                           Reviewed By :

Test Condition
Temperature :    °C                   RH : %
Ref. Gain : 64                        Spe. Gain : 4
Spectrum Range : 380-780 nm           Scan Step : 5 nm Spectroradiometric Parameters

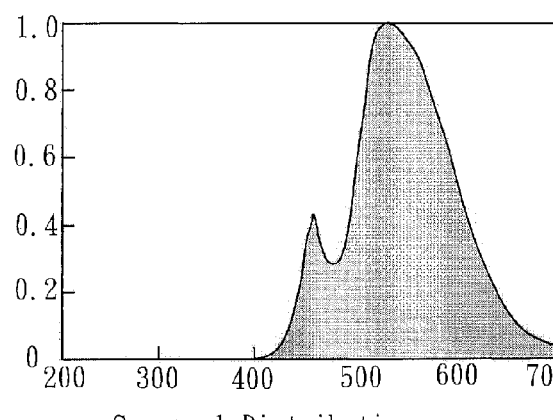
Spectral Distribution

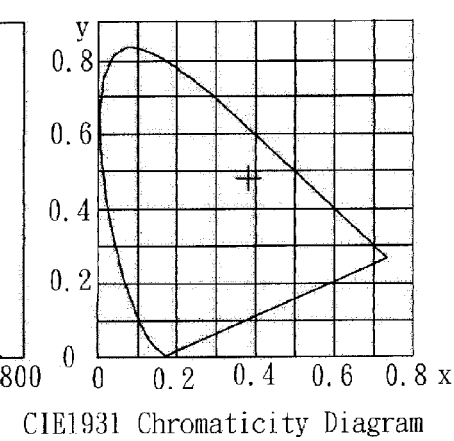
CIE1931 Chromaticity Diagram

Chromaticity Coordinates : x=0.3819 y=0.4814 u=0.1907 v=0.3605
Correlated Color Temperature : 4495 K
Brightness : 35057.0
Reference White : C Light            Peak Wavelength : 544.6 nm
Dominant Wavelength : 566 nm         Bandwidth : 112.3 nm
Purity : 0.6367                      Radiant Brightness : 84.245
Color Ratio : Kr=38.1% Kg=41.7% Kb=20.2%
Rendering Index : Ra=60.3
R1=50    R2=68    R3=91    R4=49    R5=49    R6=60    R7=81    R8=36
R9=-95   R10=31   R11=40   R12=17   R13=55   R14=94   R15=36

SPR-920D Analyzer System for Phosphor
Spectroradiometric made by
Zhejiang University Sensing Instruments Co., Ltd.

FIG. 4

Spectroradiometric Analysis Report for Phosphor

Product : Gd-353-1-w-a1-1485c-465nm-20ma
Manufacturer :
Client :
Sample No. :                              Date : April 8, 2008
Tested By :                               Reviewed By :

Test Condition
Temperature :     °C                      RH : %
Ref. Gain : 64                            Spe. Gain : 4
Spectrum Range : 380-780 nm               Scan Step : 5 nm Spectroradiometric Parameters

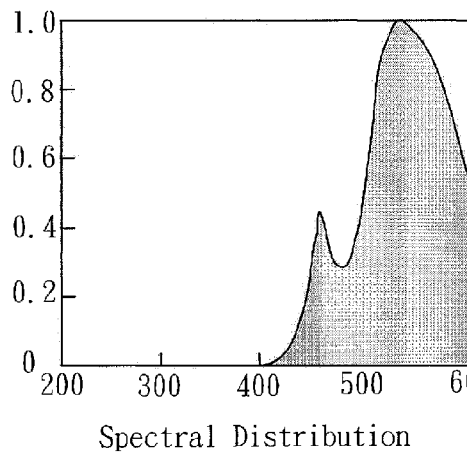

Spectral Distribution

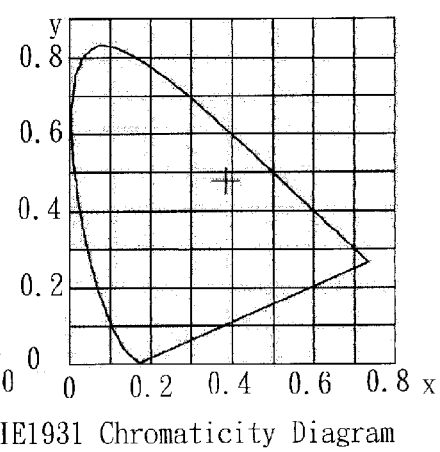

CIE1931 Chromaticity Diagram

Chromaticity Coordinates : x=0.3854  y=0.4772  u=0.1938  v=0.3599
Correlated Color Temperature : 4413 K
Brightness : 35098.2
Reference White : C Light                 Peak Wavelength : 547.7 nm
Dominant Wavelength : 567 nm              Bandwidth : 112.9 nm
Purity : 0.6360                           Radiant Brightness : 85.434
Color Ratio : Kr=39.4%  Kg=40.8%  Kb=19.8%
Rendering Index : Ra=61.3
R1=51    R2=69    R3=91    R4=50    R5=50    R6=60    R7=81    R8=37
R9=-88   R10=32   R11=42   R12=17   R13=57   R14=94   R15=39

SPR-920D  Analyzer System for Phosphor
Spectroradiometric made by
Zhejiang University Sensing Instruments Co., Ltd.

FIG. 5

Spectroradiometric Analysis Report for Phosphor

Product : Gd-350-2-al-1475c-465nm-20ma
Manufacturer :
Client :
Sample No. :　　　　　　　　　　　　　　Date : April 7, 2008
Tested By :　　　　　　　　　　　　　　Reviewed By :

Test Condition
Temperature :　　°C　　　　　　　　　　RH : %
Ref. Gain : 64　　　　　　　　　　　　Spe. Gain : 4
Spectrum Range : 380-780 nm　　　　　Scan Step : 5 nm Spectroradiometric Parameters

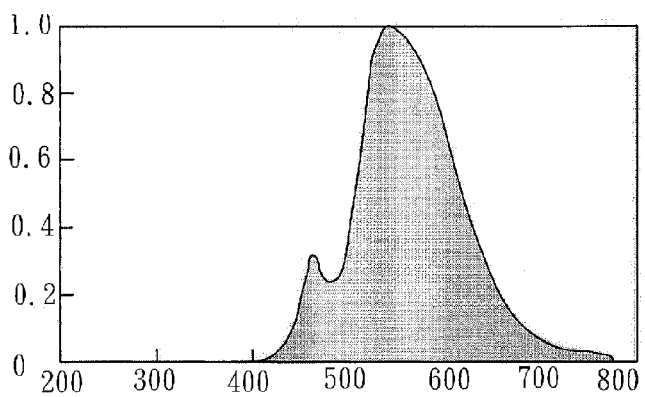

Spectral Distribution

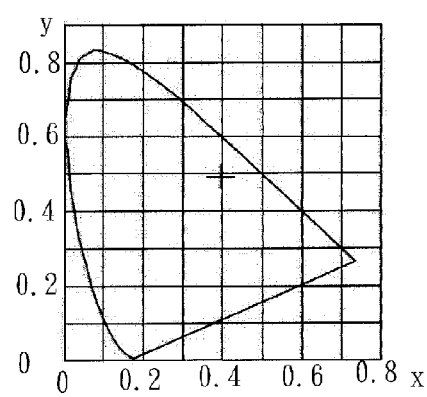

CIE1931 Chromaticity Diagram

Chromaticity Coordinates : x=0.3972 y=0.4918 u 0.196 v=0.364
Correlated Color Temperature : 4251 K
Brightness : 34472.7
Reference White : C Light　　　　　　　Peak Wavelength : 547.5 nm
Dominant Wavelength : 568 nm　　　　　Bandwidth : 113.0 nm
Purity : 0.7093　　　　　　　　　　　　Radiant Brightness : 82.23
Color Ratio : Kr=41.2% Kg=41.8% Kb=17.0%
Rendering Index : Ra=59.8
R1=50　　R2=67　　R3=89　　R4=49　　R5=48　　R6=58　　R7=81　　R8=36
R9=-90　　R10=28　　R11=39　　R12=14　　R13=55　　R14=94　　R15=37

SPR-920D  Analyzer System for Phosphor
Spectroradiometric made by
Zhejiang University Sensing Instruments Co., Ltd.

FIG. 6

Spectroradiometric Analysis Report for Phosphor

Product : Gd-350-2-a1-1475c-465nm-20ma
Manufacturer :
Client :
Sample No. :                                Date : April 7, 2008
Tested By :                                 Reviewed By :

Test Condition
Temperature :     °C                        RH :    %
Ref. Gain : 64                              Spe. Gain : 4
Spectrum Range : 380-780 nm                 Scan Step : 5 nm Spectroradiometric Parameters

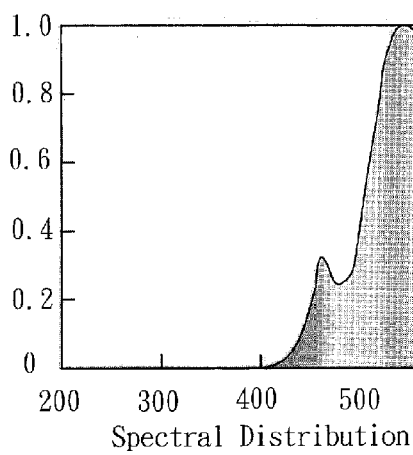
Spectral Distribution

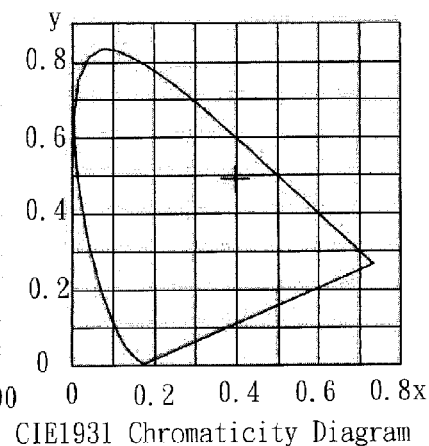
CIE1931 Chromaticity Diagram

Chromaticity Coordinates : x=0.3972 y=0.4918 u=0.196 v=0.364
Correlated Color Temperature : 4251 K
Brightness : 34472.7
Reference White : C Light                   Peak Wavelength : 547.5 nm
Dominant Wavelength : 568 nm                Bandwidth : 113.0 nm
Purity : 0.7093                             Radiant Brightness : 82.23
Color Ratio : Kr=41.2%  Kg=41.8%  Kb=17.0%
Rendering Index : Ra=59.8
R1=50    R2=67    R3=89    R4=49    R5=48    R6=58    R7=81    R8=36
R9=-90   R10=28   R11=39   R12=14   R13=55   R14=94   R15=37

SPR-920D Analyzer System for Phosphor
Spectroradiometric made by
Zhejiang University Sensing Instruments Co., Ltd.

FIG. 7

Spectroradiometric Analysis Report for Phosphor

Product : Gd-351-1-a1-1475c-465nm-20ma
Manufacturer :
Client :
Sample No. :                                          Date : April 7, 2008
Tested By :                                           Reviewed By :

Test Condition
Temperature :    °C                                   RH : %
Ref. Gain : 64                                        Spe. Gain : 4
Spectrum Range : 380-780 nm                           Scan Step : 5 nm Spectroradiometric Parameters

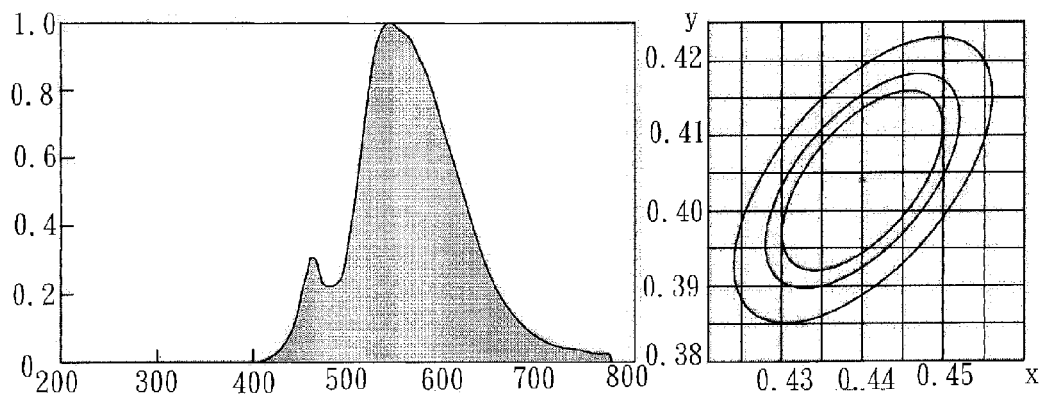

Spectral Distribution                    Warm White Light           2900K
                                         x0=0.440      y0=0.403
                                         L:8SDCM    M:6SDCM    S:5SDCM Chromaticity Coordinates : x=0.3999 y=0.4920 u=0.1974 v=0.3643
Correlated Color Temperature : 4205 K
Brightness : 32989.0
Reference White : C Light                Peak Wavelength : 548.0 nm
Dominant Wavelength : 568 nm             Bandwidth : 111.9 nm
Purity : 0.7143                          Radiant Brightness : 78.622
Color Ratio : Kr=41.8%   Kg=41.8%   Kb=16.3%
Rendering Index : Ra=59.7
R1=50    R2=67    R3=88    R4=49    R5=48    R6=57    R7=82    R8=37
R9=-89   R10=27   R11=39   R12=12   R13=55   R14=93   R15=37

SPR-920D Analyzer System for Phosphor
Spectroradiometric made by
Zhejiang University Sensing Instruments Co., Ltd.

FIG. 8

WHITE LIGHT-EMITTING DIODE AND ITS LIGHT CONVERSION LAYER

FIELD OF THE INVENTION

The present invention relates to the field of electronics, and in particular to a fluorine oxygen garnet phosphor powder related to the modern technology field broadly called "Solid State Lighting" and a white light-emitting diode employing the fluorine oxygen garnet phosphor powder.

BACKGROUND OF THE INVENTION

With the technology foundation of the Solid State Lighting, some lighting facilities have been produced for daily and landscape uses as well as high power lighting facilities for industrial uses. These lighting facilities have a somewhat lower color temperature, $T \leq 3,500K$, falling into the category of Warm White Lighting. If the color temperature is higher, $T > 4,600K$, the semiconductor facilities will be categorized as Cold White Light.

Most modern lighting facilities are usually bulky. Semiconductor lighting facilities having small volume and high power, therefore, are of very high demand.

To overcome the aforementioned drawback, it is essential to have a special single piece high-power device in semiconductor light sources. This technology has been developed so far no more than 20 years and a Japanese engineer S, Nakanura proposed a new lighting framework based on indium nitride (InN) and gallium nitride (GaN), comprising In—Ga—N heterojunction (or P-N junction) with a large number of quantum wells in nanometer scales (please refer to the 1997 technical papers "The Blue Laser diode Sp. 1997" published by S, Nakanura; the content of this paper will not be detailed herein.).

This new development is based on a heterojunction device, Stokes inorganic phosphor powder conversion layer based on the framework of gallium nitride semiconductor framework, proposed by Russian engineers 30 years ago. The aforementioned conversion layer is the anti-Stokes phosphor powder originally used in light-emitting diodes.

In 1998, an engineer, S, Nakamura, working for the Nichia Company developed a white light-emitting diode based on the primary blue light of semiconductor from light-emitting-diodes. The blue light emission of the semiconductor heterojunction in light-emitting diode is combined with yellow light emission generated by a large amount of phosphor powder to obtain uniform white light according to the Newton Complementary Color Principle (Blue and yellow are complementary colors.). The aforementioned white light emission has been widely used in black-and-white television screen and RADAR device.

Japanese engineers exploit their available patents and technologies to ensure an overall white light emission generated from a light conversion layer of semiconductor heterojunction. Light conversion layer is indispensible in optical devices for complementary colors, conical reflection and internal conical devices, optical lenses, and light guiding apparatus; however, some aspects of this technology remain to be improved. For example, when the heterojunction is placed on sapphire single crystal substrate, heat will be generated if the power is larger than 100 mini-watt, since sapphire has low heat conductivity (about 45 W/MK) and heat cannot be effectively dissipated from the chip of light-emitting diodes. Many methods have been exploited to overcome the drawback; dielectric SiC, for example, has heat conductivity three times or more of that of sapphire, leading to even higher power excitation. Such a device is first developed by an American company Cree; however, the cost is extremely high.

Semileds Company has engaged in resolving the issue of thermal stability of light-emitting diodes from its root cause by directly placing the semiconductor heterojunction onto copper substrate. Semileds's engineers put the semiconductor heterojunction made of In—Ga—N directly upon copper substrate. This approach employs a very special barrier to stop the diffusion between heterojunction and copper substrate.

Nevertheless, there are some drawbacks remained. Although the package of high-power light-emitting diodes has the characteristic of low heat resistance, the phosphor powder particles in light conversion layer are stilled heated. As a result, the luminescence quantum output of phosphor powder will decrease. For example, aluminum-yttrium garnet phosphor powder $((Y,Gd, Ce)_3Al_5O_{12})$, developed by the well-known Nichia Company has experienced a reduction of 25% for this parameter at $T=373K$. For this special series of phosphor powder, if Gd atom concentration ([Gd]) is increased to 0.5, this parameter will decrease by 50% at $T=350K$.

SUMMARY OF THE INVENTION

To overcome the prior drawbacks described above, the main objective of the present invention is to provide a white light-emitting diode and its fluorine oxygen garnet phosphor powder.

To overcome the prior drawbacks described above, another further objective of the present invention is to provide a white light-emitting diode and its fluorine oxygen garnet phosphor powder, which can create a brighter white light-emitting diode with a luminous efficacy over 100 lumen/watt under voltage$\leq 3.1$ V and current $I \approx 350$ mA.

To overcome the prior drawbacks described above, a further objective of the present invention is to provide a white light-emitting diode and its fluorine oxygen garnet phosphor powder, which does not experience a decrease in power after 5 to 10 minutes of first working time.

To achieve the aforementioned objectives, a white light-emitting diode according to the present invention is based on In—Ga—N nitride heterojunction directly formed on copper substrate and has primary blue light emission of a specific wavelength and a light conversion layer so as to generate white light.

To achieve the aforementioned objectives, a light conversion layer according to the present invention can be used in a white light-emitting diode to convert the blue light emitted from a In—Ga—N heterojunction into white light; the light conversion layer is based on phosphor powder and inorganic silicon polymer which has a molecular mass of $M=15000 \sim 25000$ carbon units with a mass ratio of 15~55% to the inorganic phosphor powder polymer and is solidified in a certain period of time at a specific temperature.

BRIEF DESCRIPTION OF THE DRAWINGS

The present invention can be more fully understood by reference to the following description and accompanying drawings, in which:

FIGS. 2 to 8 illustrate the spectrum analysis of the phosphor powder measured by the spectroradiometer of Sensing Instruments Company.

DETAILED DESCRIPTION OF THE INVENTION

Figure 1:
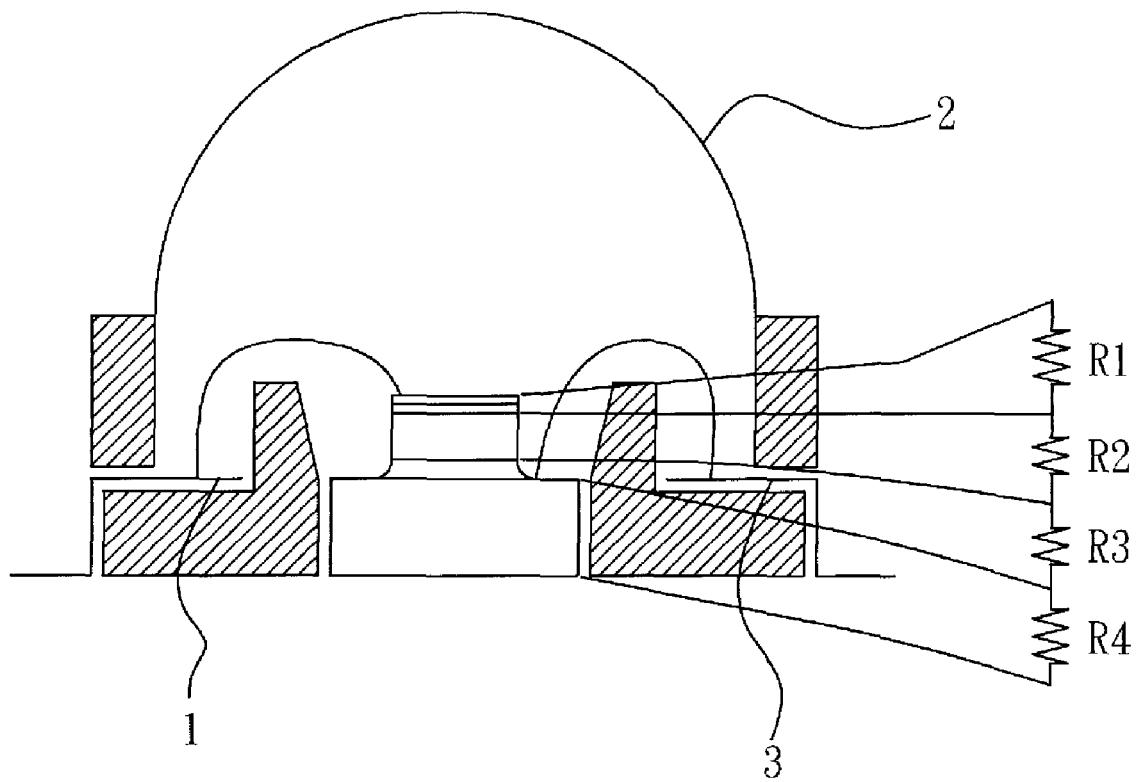
FIG. 1 schematically illustrates the distribution of heat resistance of a light-emitting diode according to the present invention.

First, the objective of the present invention is to overcome the drawbacks of the aforementioned phosphor powder and the light-emitting diode using the phosphor powder. To achieve the objectives, a white light-emitting diode according to the present invention based on In—Ga—N nitride heterojunction is directly formed on copper substrate and has primary blue light emission of a specific wavelength and a light conversion layer so as to generate white light, wherein the specific wavelength is $\lambda=450\pm2$ nm.

The color temperature of the white light is 5,500~6,600K and its luminous flux is over 100 lumens when the total power is 1 watt.

When the total area of the nitride heterojunction is 1.0~1.2 square mini-meters, the light conversion layer forms light on radiation surface and when the chromaticity coordinate of the integrated white light emission is: $0.31<x\leq0.34$ and $0.316\leq y \leq0.354$, its luminous flux is more than $F/y=310$ lumens.

Wherein the radiation surfaces and facets around the light conversion layer have the same thickness, the symmetrical centers coincides with the diagonals intersection of the front radiation surfaces, and the optical thickness of all sides of the light conversion layer is 80~120 μm.

Wherein the luminous intensity is over $1\geq102$ cd when the half-power angle is $2\theta=60°$.

Wherein the luminous efficacy of the white light-emitting diode is $\eta\geq106$ lumen/watt and the change in luminous efficacy ($\Delta\eta$) is less than 1~2% after incessant working for 1,000 hours.

Wherein the color rendering index of the white light-emitting diode is $Ra\geq82$.

Wherein the light conversion layer is based on a phosphor powder activated by cerium and organic silicon polymer which has a molecular weight of M=15,000~25,000 carbon units with a mass ratio of 15~55% to the inorganic phosphor powder polymer and is solidified in an hour at $T\geq110°$ C. Further the composition of the phosphor powder is added with fluorine ions to substitute oxygen atoms to have a cubic crystal with a lattice parameter $a\leq1.2$Å and stoichiometric formula: $(\Sigma Ln)_3Al_5O_{12-x}F_{2x}$, in which $\Sigma Ln=Y$ and/or Gd and/or Lu and/or Tb and/or Ce and/or Pr, $0.001\leq x\leq1.5$; the light conversion layer is based on the phosphor powder, wherein the optimal concentration of fluorine ion is 0.015~0.04 atomic fractions and under this condition, the afterglow period of the phosphor powder is less than $T_e<8\times10^{-8}$ seconds.

Wherein the particles of the phosphor powder have an oval shape with a median diameter of $1.2\leq d_{50}\leq2.8$ μm, every particle is an independent and natural dodecahedron crystal, and the density of the phosphor powder is as high as $\rho\approx3.2$~3.8 g/cm$^3$.

Wherein aluminum cation is coordinated with two different anions $O^{-2}$ and $F^{-1}$ to ensure a very narrow spectral radiation of the phosphor powder and the peak wavelength $\lambda_{max}=538$~556 nm distributed at the sub-energy band with a half-wavelength of $\lambda_{0.5}=112$ nm.

The physics-chemistry principle of the white light-emitting diode according to the present invention is outlined hereinafter. In the framework of the light-emitting diode according to the present invention, a nitride emission layer is directly built on a metal (copper) substrate and the light-emitting diode has a condense light conversion for the primary blue light of wavelength $\lambda=450\pm2$ nm. With a thickness of $\delta=30$ μm, the light absorption is 1/e times, wherein the parameter e is a constant 2.71. Light is fully absorbed under the thickness of 100 μm, indicating that the emission from the converter is combined with the unabsorbed primary blue light from the heterojunction to form intense white light. The color temperature is T=4,500~6,600K and its luminous flux F is 100 lumens under a total power of 1 watt.

It is understood that among the emitting colors, the primary emission is blue light with wavelength of 450±2 nm and yellow light with the dominant wavelength of 545~550 nm from the light converter. The emitted quantity of the secondary yellow light activated from the light conversion layer is higher than that of the primary blue light. These two emissions are combined to form a beam close to a white color tone with a color temperature T=5,500~6,600K.

The phenomenon of energy dissipation is called "Stokes" scattering. The discrepancy of energy lies in between the primary blue light emission wavelength $\lambda=450$ nm and the secondary yellow light wavelength $\lambda=545$ nm. The conversion efficiency of yellow light is $E=450/545\approx82.5\%$. However, the primary blue light is less sensitive to human eyes, and the secondary yellow light has a visual sensitivity 6~8 times higher than the primary blue light. Consequently, although the white light generated experiences Stokes scattering, the total brightness is increased.

The white light-emitting diode according to the present invention has a total heterojunction surface area S=1~1.2 mm$^2$ to convert light and then lead to a luminous flux of F/y=300 lumens. The chromaticity coordinate of the white light emission is $0.31\leq x\leq0.34$ and $0.316\leq y\leq0.354$. It has to point out the characteristics of the white light-emitting diode herein. First, its high luminous flux is usually resulted from its high colorimetric quality, which determines the emission of the luminous flux F on y coordinate; when the chromaticity coordinate is about $x\approx0.312$, $y\approx0.316$, the luminous flux F/y of the semiconductor device is higher than 340 lumens. The different tones of white light emitted from semiconductor devices are usually compared by the values of luminous flux. For the present warm white light, its chromaticity coordinate is $0.44\leq x\leq0.46$ and $0.43\leq y\leq0.45$. The introductory parameter of the luminous flux does not exceed $L/y\leq120$.

FIG. 1 illustrates the assembly of the device, in which the chip is fixed onto the support with silver paste and cathode 1 and anode 3 are connected with gold wire; they are packaged with other constituents in a transparent polymer case 2. The chip surface is disposed with a light conversion layer. Heat resistance occurs between each individual elements and the heat resistances are labeled as $R_1$, $R_2$, $R_3$, and $R_4$.

The heat resistance inside the chip of the device with a chip of area S=1 mm$^2$ can reach $R_1+R_2+R_3$. Under such data, the heat resistance is $R_1=0.029°$ C./W with the heat conductivity of Ga—N $K_{GaN}=170$ W/MK and a thickness of $\delta=5$ μm. If the nitride heterojunction layer is placed upon the framework of copper substrate, the heat resistance of copper substrate is $R_2=0.38°$ C./W, that of silver paste is $R_3=4.0°$ C./W, and that of copper support is about $R_4=2.0°$ C./W. Consequently, the total heat resistance is R=6.4° C./W. The heat resistance at the light conversion layer has a heat resistance of $R_u=1000°$ C./W as a result of using polymer adhesive (silicon resin with electric conductivity R=0.02 W/cmK).

It has to point out in particular that the characteristics of the light conversion layer include the followings: (1) its film is critically thin; (2) the film is loaded with phosphor powder particles to the maximum extent; and (3) the film has high radiation efficiency and high heat radiation parameter.

It is positive to conclude the aforementioned description that a light-emitting diode based on In—Ga—N heterojunction according to the present invention has a semiconductor heterojunction with a heat resistance of R=6.4° C./W and the heat resistance of the light conversion layer is $R_u$=1000° C./W. Consequently, the heat generated in the semiconductor heterojunction cannot be effectively transferred to the particles of phosphor powder, thereby preventing the working temperature of the phosphor powder particles from getting too high.

It is necessary to consider the ratio of the phosphor powder particles in the light conversion layer because the amount and size of particles should be uniformly distributed in concentration on the surface of the light conversion layer. A uniform concentration is a necessary condition and all light conversion layer should comply with this condition. This spectral converter is symmetrical to its center with a uniform thickness and the thickness of the radiation surface should not exceed 80~120 μm. A uniform thickness is an effective solution to a two-constituent light conversion layer.

For using similar material silicone as base material, the first necessary condition is that it has a chemical framework O—Si—O—C (silicate coupling), and particularly this similar material is in a state of high viscosity. The second condition is that it can be exploited for the extreme light transmittance, from 92 to 94%, of this polymer. The third condition is that when the material is in a solidified state, the mobility of the mixed constituents should be ensured. All the three conditions allow the first emission at the exterior of the light conversion layer has a high radiation output, 40~50%, to ensure the light-emitting diode to have a high efficiency.

In the experiment of the present invention, a thickness of 80~120 μm is obtained. Twenty percent of the primary blue light emission penetrates the light conversion layer and forms yellow light emission with the large amount of phosphor powder. The yellow light formed is then combined with the primary blue light emission to form white light emission. The distinct advantage of the aforementioned semiconductor device is that it shows a brightness (L) higher than $3.4 \cdot 10^7$ cd/m$^2$ under a power of W=1 watt.

Similarly, the strong radiation LED and device housing are connected under professional lenses. The lenses are produced from professional pressing moulding and the lens is made by casting polycarbonate. The results are shown in TABLE 1.

TABLE 1

| Half-power angle 2θ(°) | Luminous intensity (cd) |
|---|---|
| 6 | 12300 + 10% |
| 12 | 3080 + 10% |
| 24 | 772 + 10% |
| 30 | 500 + 10% |
| 60 | 125 + 10% |
| 120 | 35 + 10% |

It has to point out that for the light-emitting diode according to the present invention, the lens has a strong focus when a strong light is directed at 2θ=6°. In a set of lighting apparatus, there are about 100 such light-emitting diodes, and thus the axial luminous intensity of the lighting apparatus is 1.23× $10^6$ cd, sufficient to provide the lighting demand of navigation mark light and airport.

Similarly, light-emitting diodes with high optical parameters are measured by manufacturing equipment with accurate physical parameters to fill luminous flux to the hole type light ball. It should be noted that in the luminous flux test for excitation power W=1 watt, average voltage 3.0~3.4V and average current I=320 mA should be followed. The appropriate luminous flux is F=102±4% lumens. The maximum luminous flux is $F_{max}$=106 lumens and the luminous efficacy is ζ=106 lumen/watt in one-watt device.

This very high value leads to its effective parameters and luminous efficacy. At the present time, the luminous efficacy of filament lamps is only ζ=14~16 lumen/watt. For energy-saving lighting devices, mercury discharge with a wavelength λ=254 nm and mixed radiation of RGB "three primary colors," the luminous efficacy can reach 4=45~50 lumen/watt. It has to point out that the standard luminous efficacy of 20/40 watt fluorescent lamp is ζ=82~85 lumen/watt. In its commercial, OSRAM Company claims it has reached the luminous efficacy of 100 lumen/watt.

It has to point out that the so-called "cold parameter" is obtained in a measurement condition that the light source does not have the time to heat up. The luminous efficacy obtained in such a condition is compared against that of the light-emitting diode according to the present invention. The present semiconductor light-emitting diode based on In—Ga—N is directly fixed on a metallic substrate has a luminous efficacy higher than existing fluorescent lamps.

The durability parameter of the light-emitting diode according to the present invention is tested and found that after 1,000 hours of incessant working, the original luminous efficacy does not decrease, but increases by 2~6%. This result is obtained only from the LED with power of W=1 watt. In the beginning, the luminous efficacy of the present LED is 106 lumen/watt. In examining this result, it should be noted that the luminous efficacy of LEDs is associated with the non-linear characteristic of power excitation. Therefore, when W=1 watt, the luminous efficacy is 106 lumen/watt; when the power is only half, 0.5 watt, the luminous efficacy is 112 lumen/watt. At 10% of 1 Watt power, the luminous efficacy $\zeta_{0.1}$=124 lumen/watt. When the power is reduced by ten times, the luminous flux of the LED according to the present invention is F=12.4 lumens as a result of excitation. In this condition, the luminous efficacy reaches $\zeta_{0.1}$=124 lumens/watt. The excitation power is lower than 100 mini-watt.

It has to point out that LED with high luminous efficacy is different from the LED according to the present invention, which has a special luminous efficacy of ζ=106 lumen/watt under excitation power W=1 and guaranties 1,000 hours of incessant working.

FIGS. 2 to 8 show radiation spectrums of the LED according to the present invention. The spectrums are measured with the apparatus of Sensing Company.

There are two peak wavelengths in the luminescent spectrum; the first one is blue light of λ=450~460 nm and the second one is yellow light of λ=549~560 nm. Similar to the luminescence with high parameters, the parameter of the LED according to the present invention includes long working hours. The luminescent parameters of the LED according to the present invention are listed in TABLE 2.

TABLE 2

| Sample | Voltage (V) | Peak Wavelength (nm) | Dominant wavelength (nm) | x | y | CCT(K) |
|---|---|---|---|---|---|---|
| 1 | 3.362 | 451.260 | 505.876 | 0.325 | 0.343 | 5792.843 |
| 2 | 3.220 | 448.340 | 559.812 | 0.337 | 0.356 | 5276.976 |
| 3 | 3.472 | 450.890 | 496.160 | 0.322 | 0.338 | 5911.246 |
| 4 | 3.482 | 450.890 | 562.170 | 0.342 | 0.373 | 5111.566 |
| 5 | 3.455 | 450.890 | 545.167 | 0.330 | 0.354 | 5543.467 |
| 6 | 3.133 | 452.350 | 561.181 | 0.341 | 0.372 | 5148.611 |

During the process of the present invention, the ratio of polymer and phosphor powder particles largely ranges between 15% and 65%, and the optimal ratio is between 35% and 55%. The particles suspension of the phosphor powder has a very good adhesiveness between them in these concentrations, and stripping and change in viscosity do not induce detrimental influence here. Organic polymer is used to prepare suspension, which has the following molecular composition:

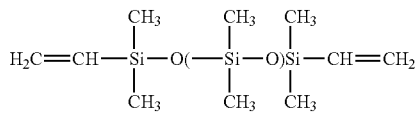

The molecular weight (M) is between 15,000 and 25,000 carbon units. From radiation grouping, it is known that the organic silicon polymer has two $H_2C=CH$ unsaturated bonds. To accelerate the solidification process, the temperature is increased to 105~120° C. in 1~2 hours. The high-concentration phosphor powder added into the suspension can ensure stability, similar to the required concentration in the conversion layer.

Nichia Company used its developed luminescent materials containing garnet to produce white LED; the chemical composition is $Y_3Al_5O_{12}$:Ce. The constituent is later added with $Gd^{+3}$, $Lu^{+3}$, and $Tb^{+3}$ ions, $Y^{+3}$ ions which partially or completely the ions in YAG:Ce, as well as $(Y,Gd)_3(Al,Ga)_5O_{12}$:Ce widely used as phosphor powder for CRT cathode luminescence. A well-known Dutch scholar was awarded with the patent for the latter material in 1967, and a detailed description of this material was published in a technical paper of Nichia Company in 1994.

The contents of previous inventions developed by the present inventors will be cited to explain the varieties of chemical compositions and the crystal structures corresponding to different compositions. The optimal chemical composition will be selected to ensure the polymer of LED proposed having high luminescent parameters, including high luminous flux F (lumen), standard chromaticity coordinate (x,y), and color temperature (CK). All polymers are certainly able to operate in high power device ($W=100W/cm^2$), which should have a high thermal stability.

To meet the requirements, the present inventors search even more qualified materials. A material meets the requirement: $(\Sigma Ln)_3Al_5O_{12-x}F_{2x}$, where $\Sigma Ln=Y$ and/or Gd and/or Lu and/or Tb and/or Ce and/or Pr and $0.001 \leq x \leq 1.5$. The variables of the phosphor powder are analyzed and the luminescence is resulted from the combination of garnet structure with activator Ce ions: (1) the chemical equivalent of garnet in the overall chemical formula is $(\Sigma Ln)_3Al_5O_{12}$; (2) the non-chemical equivalent of garnet in the overall chemical formula is $((\Sigma Ln)_2O_3)_{1.5\pm\alpha}(Al_2O_3)_{2.5\pm\beta}(\alpha\beta\neq 0)$; (3) the mixed garnet with two constituents: $((\Sigma Ln)_2O_3)_{1.5\pm\alpha}(Al_2O_3)_{2.5\pm\beta}MeOAl_2O_3$; (4) garnet comprising (La,Ce)$Sc_2Al_5O_{12}$ (after Y and Gd ions removed from cation sub-crystal) and the lattice parameter of the polymer crystal $a>12.36Å$; (5) the overall composition of silicate garnet: $Ca_3Lu_2Si_3O_{12}$:Ce; and (6) garent in which part of the oxygen ions in anion sub-crystal is substituted.

Many garnet compositions have oxygen ions, which form coordinating groups around lanthanum and aluminum ions; halide ions, such as $F^{-1}$, $Cl^-$, $Br^{-1}$ ions are highlighted. The luminous flux of the LED according to the present invention can reach F>100 lumens and color temperature $T \geq 3500K$.

The parameters of seven groups of phosphor powder based on garnet are shown in TABLE 3.

TABLE 3

| Garnet Phosphor Powder No. | 1-Watt Luminous Flux | Color Temperature CK | Radiation Wavelength | Mean Particles Size, μm |
|---|---|---|---|---|
| 1 | 80 | 6500 | λ = 560 | 6~8 |
| 2 | 90~94 | 5500~6500 | 545 ≤ λ ≤ 570 | 3~8 |
| 3 | 88~94 | 5500~6500 | 550 < 570 | 4~6 |
| 4 | 78~86 | 7500 | <560 | 2~6 |
| 5 | 74~82 | 3000 | <570 | 8~10 |
| 6 | 100 | 4000 | <560 | 6~10 |
| 7 | >105 | 3500~4500 | 550~565 | 2~6 |

The data for the garnet structure used in the white light-emitting diode with high thermal stability is listed in TABLE 3. The aim of the present invention is to overcome various issues of light conversion layer. The present invention proposes an organic phosphor powder based on oxides combined with garnet-structure rare earth elements and cerium is used as activator. Fluorine ions are introduced into the composition of the phosphor powder to substitute part of oxygen ions with the ratio from 0.5:11.5 to 3:9. The chemical equivalent is as follows: $(\Sigma Ln)_3Al_5O_{12-x}F_{2x}$, where $\Sigma Ln=Y$ and/or Gd and/or Lu and/or Tb and/or Ce and/or Pr, and $0.001 \leq x \leq 1.5$.

Before detailing the characteristics of the new phosphor powder, it is noted that the phosphor powder is related to the double-layer crystallized luminescent material. In the anion sub-crystal of phosphor powder, there are two types of ions: oxygen ion $O^{-2}$ and fluorine ions $F^{-1}$. These ions cooperatively form ion coordination polyhedrons $\Sigma Ln=Y$ and/or Gd and/or Lu and/or Tb and/or Ce and/or Pr with a vanlence of K=8. The present invention employs the garent crystal structure with a lattice parameter of $a\approx 12.0Å$. This synthesized material has red and olive drab surface layer and the energy band of its activated spectrum is λ=445~475 nm.

The luminescent radiation of the phosphor powder according to the present invention lies in the yellow-green and yellow zones of the visible spectrum. Under the excitation of short wavelength spectrum, the peak wavelength will shift by 4~8 nm. All parameters are shown in TABLE 4.

TABLE 4

| No. | Phosphor Powder Composition | $\lambda_{max}$, nm | $\lambda_{1/2}$, nm | Chromaticity Coordinate | | Color Temperature, CK | Unit Brightness |
|---|---|---|---|---|---|---|---|
| 1 | $Y_{2.94}Lu_{0.03}Ce_{0.03}Al_5O_{11.75}F_{0.5}$ | 541 | 114.4 | .3692 | .4710 | 4716 | 35098.4 |
| 2 | $Y_{2.8}Lu_{0.07}Tb_{0.1}Ce_{0.03}Al_5O_{11.5}F_1$ | 542.2 | 112.5 | .3741 | .4731 | 4623 | 35140.9 |
| 3 | $Y_{2.87}Tb_{0.06}Lu_{0.04}Ce_{0.03}Al_5O_{11.5}F_1$ | 544.6 | 112.3 | .3819 | .4814 | 4495 | 35057 |
| 4 | $Y_{2.89}Lu_{0.07}Ce_{0.04}Al_5O_{11.5}F_1$ | 545.8 | 111.2 | .3870 | .4870 | 4418 | 35869.1 |
| 5 | $Y_{2.85}Tb_{0.12}Ce_{0.03}Al_5O_{11.6}F_{0.8}$ | 547.7 | 112.9 | .3854 | .4772 | 4413 | 35098.2 |
| 6 | $Y_{2.87}Gd_{0.1}Ce_{0.03}Al_5O_{11.7}F_{0.6}$ | 547.5 | 113 | .3972 | .4918 | 4251 | 34472.7 |
| 7 | $Y_{2.85}Gd_{0.1}Tb_{0.02}Ce_{0.03}Al_5O_{11.5}F_1$ | 548 | 111.9 | .3999 | .4920 | 4205 | 32989.0 |

In TABLE 4, it can be seen that the location of the accurate amount of fluorine ion in the anion sub-crystal requires further detailed study. For the total weight concerned, the present invention first uses chemical formula to calculate the materials for production; it should bear in mind that during the weight transformation, fluorine ions are probably situated at two locations: (1) replacing oxygen ions, a possible form of $F_o$ as an effective filling for negative ions; and (2) there is special concept between Al by introducing $O^{-2}=F_o^{-1}$, or follwoing the product's sintering temperature 1420~1520° C. and 19 hours of reaction time through the constituent. Alternatively, follow the chemical composition to prepare raw materials and conduct the subsequent heat treatment includes washing in nitric acid (1 N) at T=50° C., and the surfaces of the phosphor powder particles are coated with a thin film of $ZnO·SiO_2$ and finally air dried at T=130° C. All the phosphor powders developed here have high radiation brightness L=32, 298~35,889 units; such a high parameter ensures the phosphor powder according to the present invention to exhibit a high performances. The optimal composition of the phosphor powder has the formula as $Y_{2.87}Ln_{0.1}Ce_{0.03}Al_5O_{11.95}F_{0.1}$. The wavelength of heterojunction blue light is $\lambda=450\pm5$nm and the phosphor powder is activated to emit the yellow light spectrum with a peak wavelength $\lambda=538$~548nm within a spectral range between $\lambda=548$~760nm. It has to point out that the phosphor powder re-emits the spectral bands of green light, yellow-green light, orange light, and red light.

The phosphor powder is examined by X-ray diffraction to study it special cubic crystal: the lattice parameter is $a\leq12$Å, compared to the lattice parameter $a=12.009$Å of the garnet with chemical composition of $Y_3Al_5O_{12}$. Cationic ions have a larger diameter, such as yttrium, gadolinium, cerium, which are surrounded by eight oxygen ions. However, part of oxygen ions in the phosphor powder according to the present invention are substituted with fluorine ions, leading to different ionic radii; the radius of oxygen ion $T_{o-2}=1.32$Å and that of fluorine ion $T_{F-1}=1.28$Å. Consequently, the radius of fluorine ion is smaller and thus the static electric field of the phosphor powder becomes stronger, thereby enhancing the radiation intensity of cerium ions. Another characteristic is that the special static electric field is pleiotropic and thus connects oxygen and fluorine ions with different radii for filling; fluorine ions have more independent filling than oxygen ions and thus it is an aliovalent ionic substitution. The effects of employing fluorine ions with different radius to substitute oxygen ions are as follows: (1) reducing the ionic spacing in the garnet crystal; (2) reducing the internal cohesion of the crystal; and (3) destroying the internal symmetry of garnet crystal.

In addition to increasing intensity of cerium ion radiation, the shape of the luminescent spectrum curve will also be changed; the half-wavelength width of spectral curve is reduced and the spectral curve becomes asymmetrical. Compared with the long wavelength portion of its spectrum curve, the area of its short wavelength portion is smaller. For the standard yttrium-aluminum garnet phosphor powder $Y_3Al_5O_{12}$, when the temperature is heated to 125° C., the activated conversion efficiency is reduced by 25%; for the phosphor powder according to the present invention, the activated conversion efficiency is reduced by 25% when the temperature is heated to 175° C. It is clear that the phosphor powder according to the present invention has a better thermal stability. Further, the optimal concentration of yttrium added into the new material is [Ce]=0.015~0.04 atomic fraction and the afterglow period is $\zeta=8·10^{-8}$ second. The so-called afterglow period is time required for activated phosphor powder to generate photoluminescence. Shorter afterglow indicates the number of times that phosphor powder can be activated in a given time is higher, and in turn its radiation luminescence is higher. The phosphor powder according to the present invention has a very short afterglow period and therefore is capable of generating a very high radiation luminescence.

As described above, the LED according to the present invention can emit 100~106 lumens under 1 watt of luminescent power. Alternatively, the present LED has a luminous flux of 170~180 lumens under current of 1=700 mA and power W=2 watt. Such a high luminous flux found in a single LED is unprecedented. In the synthetic process of the new phosphor powder according to the present invention, the soiled reaction temperature at 1400° C. can lead to a smaller particle size; its median particle size is $1.2\leq d_{cp}\leq2.8$, and the particles are 12-side (or more) polyhedrons with multiple facets as well as have strong gloss and high light transmittance. In the process of preparing light conversion layer, a very thin layer, 80~120 μm, of light conversion layer can be prepared. A standard light conversion layer usually has a thickness over 200 μm. The phosphor powder according to the present invention has another excellent property, a very high internal packing density; every bond of the organic phosphor powder is linked to atoms, leading to a dense characteristic. The density can be determined using radiation. The density for the phosphor powder according to the present invention is $\rho=4.60$ g/cm$^3$, compared to $\rho=2$~2.25 g/cm$^3$ for a standard yttrium-aluminum garnet phosphor powder. Therefore, the phosphor powder according to the present invention can be used make thinner light conversion layer.

Indeed, the phosphor powder according to the present invention has a very high luminous flux F>100 lumen/watt and high power distribution, and can maintain the aforementioned parameters for a long working hour.

It is appreciated that although the directional practice device of the present invention is used in a very limited space instead of practicing at the real playing field, effective and steady practice can be obtained as well. Further, it is very easy to set up and to operate the directional practice device of the present invention. These advantages are not possible to achieve with the prior arts.

While the invention has been described with reference to a preferred embodiment thereof, it is to be understood that modifications or variations can be easily made without departing from the spirit of this invention, which is defined by the appended claims.

What is claimed is:

1. A light conversion layer, used in a white light-emitting diode to convert the blue light emitted from a In—Ga—N heterojunction into white light and based on phosphor powder and inorganic silicon polymer which has a molecular weight of M=15,000~25,000 carbon units with a mass ratio of 15~55% to the inorganic phosphor powder polymer and is solidified in a certain period at a specific temperature;
   wherein the phosphor powder is inorganic phosphor powder activated by cerium and is added with fluorine ions to substitute oxygen atoms in the crystal to have a stoichiometric formula: $(\Sigma Ln)_3Al_5O_{12-x}F_{2x}$, wherein $\Sigma Ln$ is selected from a group consisting of Y, Gd, Lu, Tb, Ce and Pr and any combination thereof, and $0.001\leq x\leq1.5$.

2. The light conversion layer as defined in claim 1, wherein the specific temperature (T) is 110° C. or higher and the period is one hour.

3. The light conversion layer as defined in claim 1, wherein the composition of the phosphor powder is $Y_{2.87}Lu_{0.01}Ce_{0.03}Al_5O_{11.95}F_{0.1}$, which ensures the yellow light spectrum with a peak wavelength $\lambda=538\sim548$ nm when activated by the wavelength $\lambda=450\pm5$ nm blue light from the heterojunction.

4. The light conversion layer as defined in claim 1, wherein the phosphor powder is further added with fluorine ions to have a cubic crystal with a lattice parameter $a \leqq 1.2 \text{Å}$.

5. The light conversion layer as defined in claim 1, wherein aluminum cation is coordinated with two different anions $O^{-2}$ and $F^{-1}$ to ensure a very narrow spectral radiation of the phosphor powder and the peak wavelength $\lambda_{max}=538\sim556$ nm distributed at the sub-energy band with a half-wavelength of $\lambda_{0.5}=112$ nm.

6. The light conversion layer as defined in claim 1, wherein the optimal concentration of fluorine ion is $0.015\sim0.04$ atomic fractions and under this condition, the afterglow period of the phosphor powder is less than $T_e<8\times10^{-8}$ seconds.

7. The light conversion layer as defined in claim 1, wherein the particles of the phosphor powder have an oval shape with a median diameter of $1.2 \leqq d_{50} \leqq 2.8$ μm, every particle is an independent and natural dodecahedron crystal.

8. The light conversion layer as defined in claim 1, wherein the density of the phosphor powder is $\rho \approx 3.2\sim3.8$ g/cm$^3$.

* * * * *